United States Patent [19]

Robinson

[11] 4,156,794
[45] May 29, 1979

[54] LOUVRED HANDLE FOR ELECTRONIC EQUIPMENT RACKS AND THE LIKE

[75] Inventor: James Robinson, Smithtown, N.Y.

[73] Assignee: ILC Data Device Corporation, Bohemia, N.Y.

[21] Appl. No.: 827,739

[22] Filed: Aug. 25, 1977

[51] Int. Cl.² .................... H05K 5/02; H05K 9/00
[52] U.S. Cl. ................ 174/16 R; 16/110 R;
    49/460; 174/35 R; 174/46; 361/384
[58] Field of Search ............ 174/16 R, 35 R, 46;
    361/383, 384, 391; 16/110 R, 111 R; 49/460;
    312/244, 320, 213; 38/77.9

[56] References Cited

U.S. PATENT DOCUMENTS

| | | | |
|---|---|---|---|
| 1,399,787 | 12/1921 | Meyer | 49/460 X |
| 2,750,690 | 6/1956 | Gomersall | 38/77.9 |
| 2,922,081 | 1/1960 | Dubin | 361/391 |
| 3,057,672 | 10/1962 | Morita et al. | 361/391 X |
| 3,325,825 | 6/1967 | Christianson et al. | 174/35 R X |

Primary Examiner—Arthur T. Grimley
Assistant Examiner—D. A. Tone
Attorney, Agent, or Firm—Lerner, David, Littenberg & Samuel

[57] ABSTRACT

A louvred handle assembly for equipment racks of the removable type in which louvred elements of the handle assembly cooperate with elongated slots provided in the panel of the equipment rack to permit the flow of air therethrough, especially for cooling purposes, while at the same time preventing ingress of rain or moisture due to the orientation of the louvres and also to prevent ingress of any foreign matter such as stones or small debris. The handle itself may serve as a radiation means to conduct heat away from the equipment rack and into the atmosphere.

13 Claims, 13 Drawing Figures

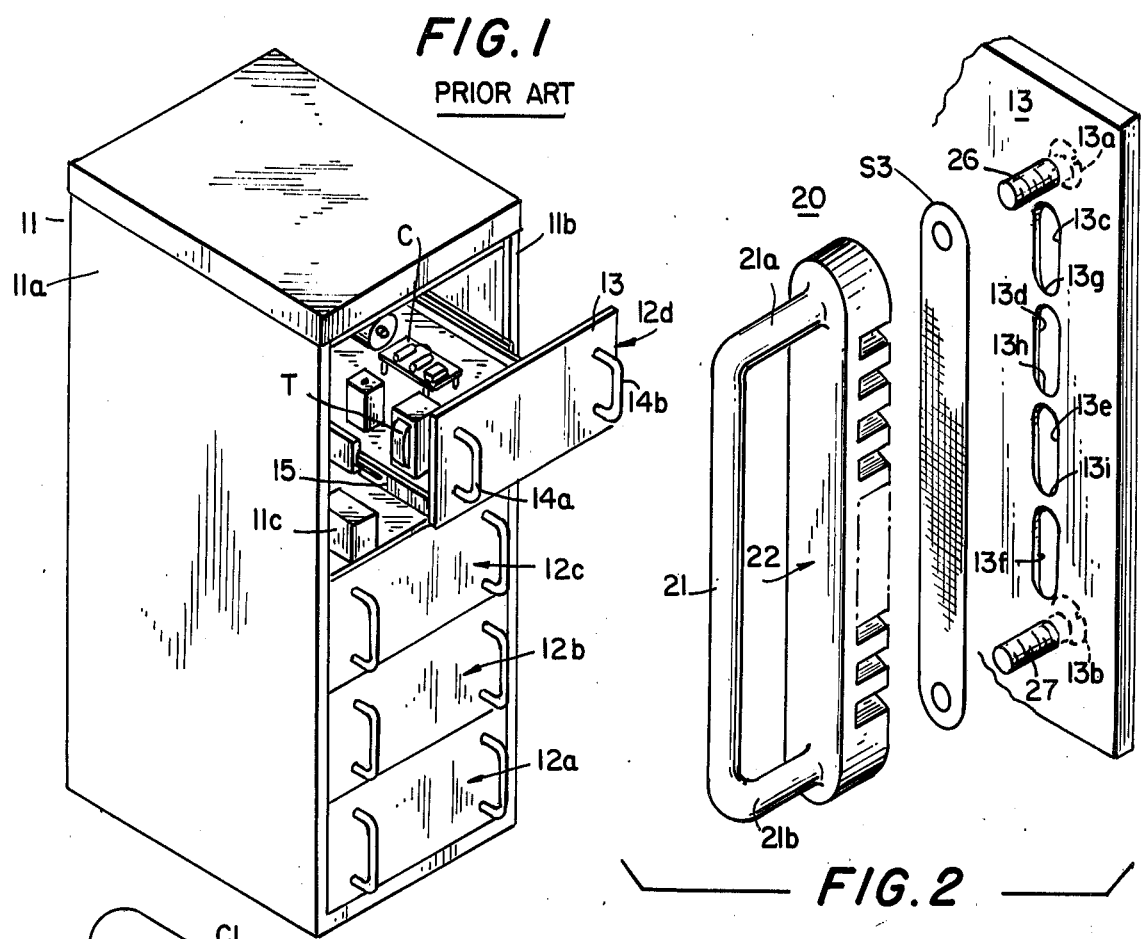
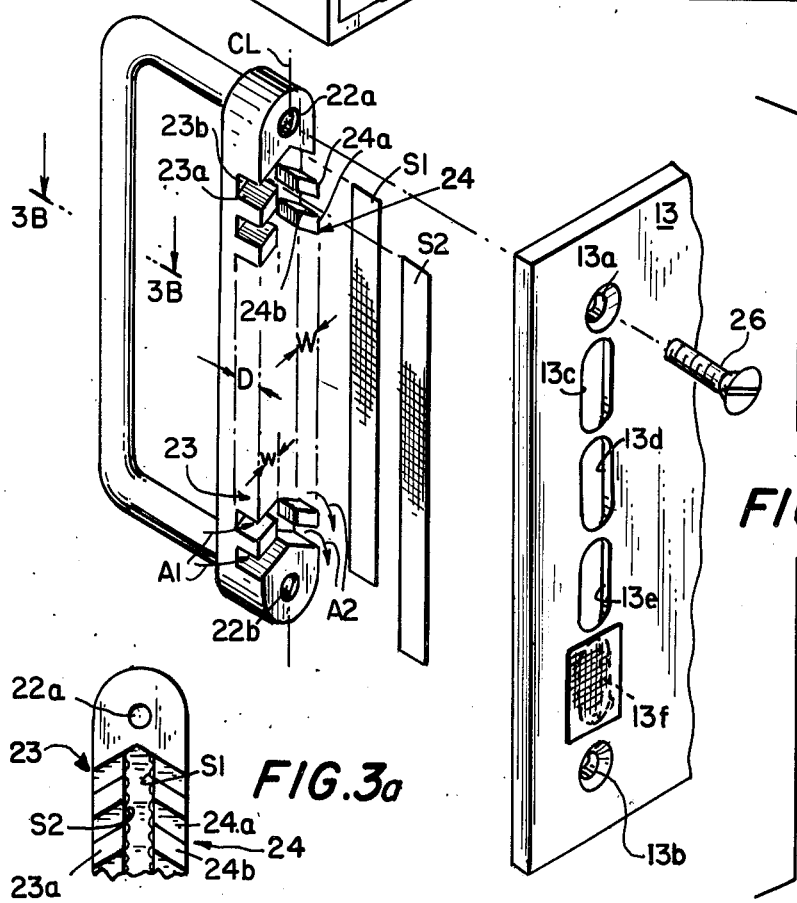

LOUVRED HANDLE FOR ELECTRONIC EQUIPMENT RACKS AND THE LIKE

BACKGROUND OF THE INVENTION

Equipment racks are quite common in the electrical and electronics industry and in a preferred form, are typically designed so as to facilitate their insertion and/or removal for maintenance, inspection and repair purposes. As such, the equipment racks are typically provided with handles to facilitate the insertion or withdrawal of the equipment racks. As is well known, the electronic components mounted in each rack are quite often capable of generating large amounts of heat thus requiring an adequate amount of cooling of the equipment to assure that the equipment will be operated at optimum temperatures to ensure a longer, more useful operating equipment life. Common techniques to accomplish these results reside in the use of active ventilating systems such as fans or blowers and in fact even air conditioning or cooling equipment. To date, no efforts have been made to utilize either the front control panel or the handles therefore as a further effective means for providing adequate cooling.

BRIEF DESCRIPTION OF THE INVENTION

The present invention is characterized by providing a louvred handle of either one-or two-piece design which is adapted to cooperate with elongated slots or openings provided in the equipment rack front panel face to thereby provide air flow and hence cooling of the electronic equipment through the front face while at the same time providing a louvered arrangement which presents a tortuous path to prevent ingress of undesirable matter such as water or moisture and small debris which may be present especially in the event of outdoor equipment usage.

The louvered handle assembly is comprised of a handle portion joined to a louvered body member, either as an integral unit or as a two-piece unit, forming a handle assembly which is mounted against the exterior surface of the equipment rack front panel. The front panel is provided with openings for receiving fastening means to secure the handle assembly thereto and with one or a plurality of elongated slots arranged between the fastener receiving openings and cooperating with the sets of louvers to permit relatively free movement of air either into or out of the equipment rack. The front panel face and the louvered assembly provide for cooling of the electronic equipment.

The handle may be either a one- or two-piece assembly wherein one or both pieces may be formed of plastic or metal. In the event that further cooling is desired, both pieces may be formed of metal to conduct heat away from the rack. Screening may be provided within the handle assembly or behind the slots in the control panel to assure the shielding of EMI and RFI energy.

The length of each of the louvers may be adjusted to prevent the louver handle assembly from adding to the static pressures of the overall system. A central channel may also be provided, in cases where the louver handle is utilized as an air intake, to form a reservoir of air for the system, which channel is constantly replenished by the air entering through the louvered openings.

OBJECTS OF THE INVENTION AND BRIEF DESCRIPTION OF THE FIGURES

It is therefore one object of the present invention to provide a novel louvered handle assembly for use with electronic equipment racks and the like to facilitate cooling of such racks while at the same time preventing the ingress of undesirable elements into the rack interior.

Another object of the present invention is to provide a novel louvered handle assembly of the type described hereinabove and which may be of either one- or two-piece design and may be formed of any suitable material such as plastic or metal.

Still another object of the present invention is to provide a louvered handle assembly of the type described hereinabove in which the louvers may be adjusted in both length and angular orientation to control the rate of flow of air therethrough.

The above as well as other objects of the present invention will become apparent by reading the accompanying description and drawings, in which:

FIG. 1 is a highly simplified perspective view of a typical electronic rack assembly which may employ the present invention to great advantage.

FIGS. 2 and 3 show detailed perspective views of the louvered handle assembly of the present invention and the manner in which it cooperates with the front panel of the equipment racks shown in FIG. 1.

FIG. 3a shows a rear view of the louvre portion of FIG. 3.

FIGS. 3b and 3c show section views of the embodiment of FIG. 3 looking in the direction of arrows 3B—3B.

DETAILED DESCRIPTION OF THE INVENTION

Figure 4A:
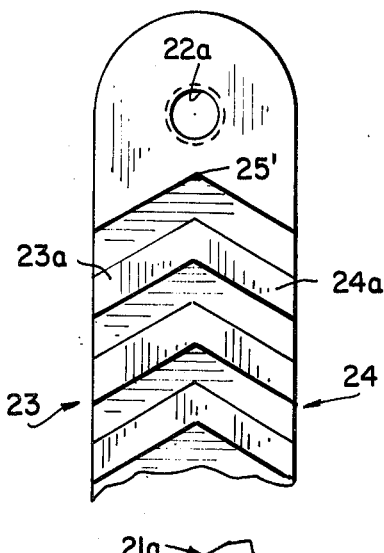
FIGS. 4a and 4b show front views of alternative louvre designs.

FIG. 1 shows a typical equipment rack for electronic equipment and the like which is comprised of a frame or housing 11 having a plurality of individual racks 12a through 12d, of electronic equipment, wherein racks 12a through 12c are shown as being in their fully inserted or assembled position while rack 12d is shown as being partially removed from the housing, and a position 11c in housing 11 is shown as being adapted for insertion of still another electronic equipment rack which has been totally removed therefrom.

Considering the equipment rack 12d, it can be seen that this structure is comprised of a front panel 13 having handles 14a and 14b to facilitate insertion or removal thereof. The front panel is secured to a chassis 15 which, while not shown in detail, should be understood to include a runner on opposite horizontal sides thereof, which cooperate with suitable grooves provided along both interior surfaces of the side walls 11a through 11b of housing 11 to accommodate the runners of the chassis 15 and thereby facilitate rapid and simple insertion and/or removal of the electronic rack. Alternatively, the front panel may be hinged along one side thereof so as to swing open to gain access to the interior. Mounted on the chassis are a number of electronic components which may for example be a Transformer T, capacitor C and other electronic components of either passive or active types such as resistors, capacitors, transistors, vacuum tubes and integrated circuits of any diverse type.

In order to adequately protect such electronic equipment, the front panels 13 cooperate with the housing 11 to substantially completely enclose the electronic equipment therein. Since the components and/or circuits mounted within the housing 11, when energized, are capable of generating large amounts of heat, it is necessary to provide suitable means for cooling the electronic elements especially to assure their operation at a temperature level which provides optimum operating conditions and contributes to a longer, more useful operating life. One especially effective way of accomplishing this result resides in the invention of the present application which, as shown best in FIGS. 2 and 3, is comprised of a louvered handle assembly 20 having a substantially U-shaped handle portion comprised of a central or yoke portion 21 and two integrally joined parallel extending arms 21a and 21b. In one preferred embodiment, the outward ends of the arms are integrally joined to an elongated body 22 having a plurality of louvers arranged as first and second louver sets 23 and 24. The louver set 23 is comprised of individual louvers 23a which are integrally joined to body 22 and extend outwardly therefrom wherein each of the louvers are arranged in spaced parallel fashion relative to one another and in which the louvers are aligned at a predetermined angle to the horizontal plane, the example of FIG. 3 showing the angular orientation to the horizontal as being at least 45°. The angle can be either less or more than 45° if desired, and preferably within the range from 25° to 75° relative to a horizontal plane.

The arrangement of the louvers is such as to provide spaces or gaps 23b therebetween to permit the flow of air, as shown by arrows A1, into the center portion thereof or out of the center portion thereof as shown by the arrows A2 (with respect to the louver members of louver set 24.)

The louver set 24 is a similar arrangement and is comprised of individual louvers 24a arranged in spaced parallel fashion in a manner substantially the same as louvers 23a to form two sets which are substantially symetrically arranged about a longitudinal center line CL shown in FIG. 3, with the gaps 24b between adjacent louvers 24a being of similar spacing as gaps 23b and with the angular orientation being the same as individual louver elements 23a.

As shown in FIG. 4a the louvers may be integrally joined to one another at their apices 25' or, alternatively may be provided with spaces or gaps between adjacent inner ends of the louvers so as to cooperatively form an elongated center channel 25 whose function will be more fully described hereinbelow.

The upper and lower ends of body 22 are each provided with a tapped aperture 22a and 22b for threadedly receiving and engaging fastening members such as for example the threaded bolt 26 shown in FIG. 3.

In the event that the handle 21 and body portion 22 are formed as two separate elements, the openings 22a and 22b may be utilized as clearance openings and the free ends of arms 21a and 21b are then preferably provided with tapped apertures for threadly engaging the fastening members 26 and 27.

The fastening members 26 and 27 are adapted to extend through openings 13a and 13b, respectively provided in the front panel 13 so that, when tightened, the mounting hardware firmly joins the handle 21 and body member 22 to the front control panel 13. The latter two-piece arrangement enables the louvered body member 22 to be molded or otherwise formed so as to fully and completely accommodate existing handle members thereby minimizing cost fabrication and assembly as well as enabling use of the louvered handle members on existing equipment as well as new equipment.

The control panel is designed to provide a plurality of elongated openings or slots 13c through 13f which are arranged to lie substantially along an imaginary straight line extending between mounting hardware openings 13a and 13b. This arrangement assures that the slots will be provided in alignment with the louver arrangement to assure maximum ingress and egress of air therethrough. The elongated louver member is mounted in place upon the front face of the control panel. Although one single elongated opening may be provided, minimum web portions 13g, 13h and 13i are preferred between each of the elongated slots in order to enhance the structural strength of the front panel in the region of the elongated slots.

As shown in FIG. 3, the handle may be molded in various shapes in cross-section and is preferably either round or elliptical as shown at the cross-sections 21d and 21e of FIGS. 3b and 3c.

Figure 4B:
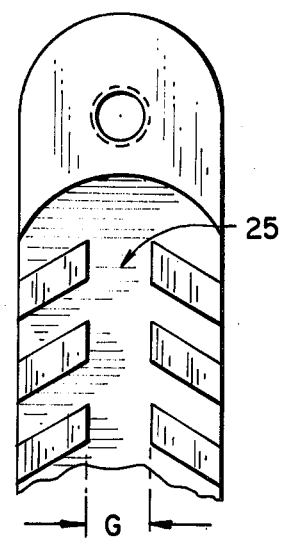

By controlling the length D of each louver (i.e., the depth of the gaps between louvers), as well as the width W of the gaps, it is possible to minimize resistance to air flow and thereby control the amount of air flow desired. In adjusting the width W of the louvers, it is possible to control the gap size G of the center channel 25 (see FIG. 4B) so as to provide a reservoir of air for the system, which reservoir is constantly replenished by the air flowing through the louvered openings.

In the event that it is important to provide for shielding of EMI and RFI energy, metallic screening may be placed against the interior surface of the front panel 13 so as to completely cover the openings 13c through 13f. An adhesive, a mounting frame or conventional fastening means may be used to secure the screen to the panel 13. FIG. 3 shows a small screening portion as covering opening 13f. It should be understood that screening of a length and width sufficient to cover all openings may be provided. As an alternative arrangement, screening may be integrally molded or joined along the interior ends of each of the louvres 23a and 24a as shown by the screening sections S1 and S2 which extend the entire length of center channel 25 and along both sides of the channel so as to engage the inner surfaces of the sets of louvres 23a and 24a.

Figure 6:
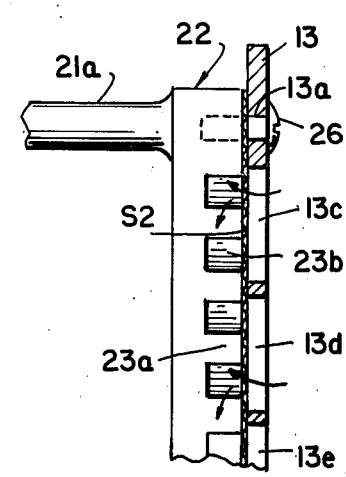
FIG. 6 shows a portion of the embodiment of FIG. 2 in the assembled condition.

As another alternative arrangement, the screening may be provided as a single elongated oval shaped piece S3 as shown in FIG. 2 so as to be "sandwiched" between the front face of control panel 13 and the controlling surface of the louvered body member 22, when assembled as in FIG. 6.

The arrangement utilized substantially eliminates the possibility of the entry of rain or moisture into the interior of the equipment rack and also eliminates possible entry of objects foreign to the equipment such as for example loose hardware, stones and the like. The assembly may be formed in a one-piece or a two-piece fashion and may be formed of either metal or plastic. For example, the one-piece member may be formed of either metal or plastic and the individual members of the two-piece assembly may be formed of either metal or plastic in any desired combination.

Figure 5A:
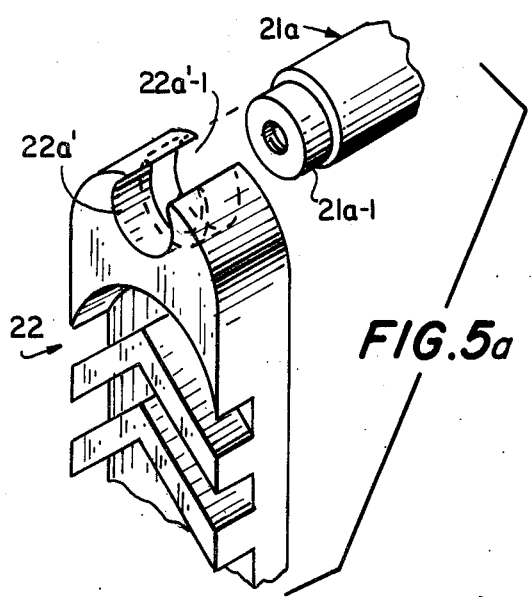
FIGS. 5a-5d show alternative arrangements for louvre assemblies of the two-piece type designs.
Figure 5B:
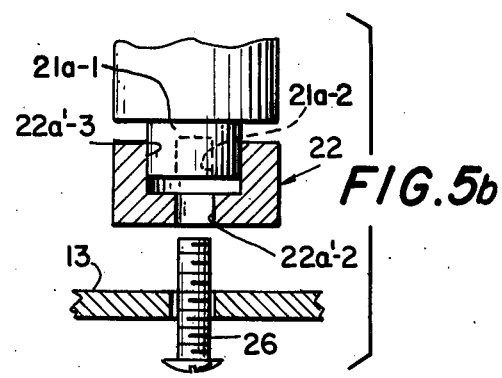

FIGS. 5a through 5d show alternative arrangements for two-piece assemblies. As shown for example in FIG. 5a, in a perspective view, the handle portion 21a is provided with a reduced diameter portion 21a-1. The upper end of louvered body member 22, as an alternative to the opening 22a, is provided with an opening 22a' which opens to one end of the assembly as shown at 22a'-1. FIG. 5b shows a sectional view of the opening 22a' in which a first portion 22a'-2 is of a reduced diameter in which the remaining portion 22a'-3 is of an increased diameter. The arm portion is shown as being inserted with the reduced diameter portion 21a-1 assembled within the enlarged diameter portion 22a'-3. A threaded fastening member 26 extends through clearance opening 22a'-2 and threadedly engages the tapped opening 21a-2 in the handle arm 21a. The control panel 13 is shown as being sandwiched between the louvered body member 22 and the head of the fastening member 26.

Figures 5C, 5D:
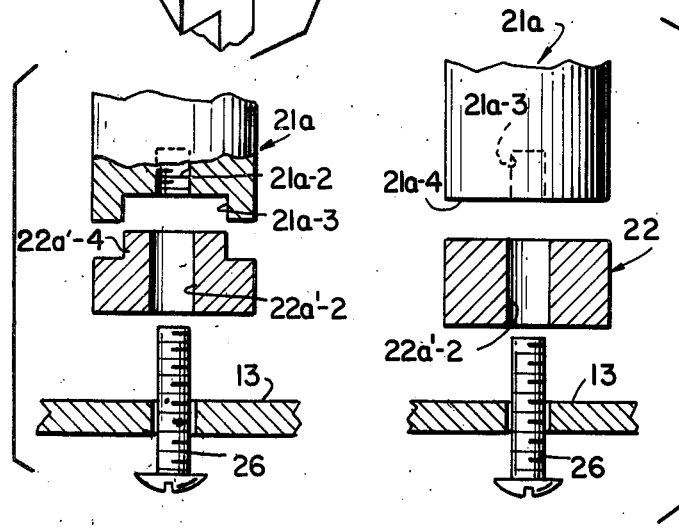

In a reversed arrangement shown in FIG. 5d, the louvered body member 22, in place of having an opening 22a'-3, is provided with a projecting portion 22a'-4 which is received within a circular shallow recess 21a-3 in the arm 21a. The fastening member 26 extends through clearance opening 22a'-2 in the louvered body member and threadedly engages tapped aperture 21a-2.

The embodiments of FIGS. 5b and 5d show an arrangement in which the louvered body member and the handle portion nest into one another. Obviously it should be understood that the openings at both ends of the louvered body member and both arm portion would be designed in a similar fashion, the opposite ends of the arms and the opposite ends of the louvered body member being omitted for purposes of simplicity. In the embodiment of FIG. 5c, the clearance hole 22a'-2 is shown as extending through the thickness of the louvered body member and no nesting means is provided, the arm portion 21a having a flat end face 21a-4 engaging the flat surface of the louvered body member adjacent thereto. The fastener 26 extends through clearance opening 22a'-2 and threadedly engages tapped aperture 21a-3. As can clearly be seen, the embodiments of FIGS. 5a through 5d show alternative arrangements in which the two-piece elements may be quickly and readily assembled relative to one another and in turn may be mounted upon and securely fastened to the front panel 13.

Although there has been described a preferred embodiment of this novel invention, many variations and modifications will now be apparent to those skilled in the art. Therefore, this invention is to be limited, not by the specific disclosure herein, but only by the appending claims.

What is claimed is:

1. A handle and panel assembly, comprising:
a panel having a front face, a rear face, and first passageway means extending therethrough from said rear face to said front face, and
a handle having a base portion attached to said front face of said panel and overlying said first passageway means, said base portion including second passageway means extending therethrough and communicating with said first passageway means, said second passageway means cooperating with said first passageway means to form a channel for permitting air to flow through said panel from said rear face thereof to said front face thereof, said channel having dimensions selected to permit a predetermined air flow therethrough.

2. A handle and panel assembly according to claim 1, wherein said first passageway means is arranged at an angle with respect to said second passageway means, so that said channel is elbow-shaped.

3. A handle and panel assembly according to claim 1, wherein said first passageway means is a single opening.

4. A handle and panel assembly according to claim 1, wherein said first passageway means is a multiplicity of openings.

5. A handle and panel assembly according to claim 1, wherein said base portion of said handle has a rear wall mounted adjacent to said front face of said panel, a front wall opposite said rear wall, and a pair of sidewalls, said second passageway means being a multiplicity of spaced-apart grooves formed in said rear wall of said base portion and extending to at least one of said pair of sidewalls.

6. A handle and panel assembly according to claim 5, wherein said grooves extend from one of said pair of sidewalls to the other of said pair of sidewalls.

7. A handle and panel assembly according to claim 6, wherein said grooves are V-shaped in a plane parallel to said front face of said panel.

8. A handle and panel assembly according to claim 5, wherein said grooves are formed in two sets, one of said sets extending to one of said pair of sidewalls and the other of said sets extending to the other of said pair of sidewalls, each groove of said sets communicating with a slit formed in said rear wall of said base portion intermediate said pair of sidewalls.

9. A handle and panel assembly according to claim 8, further comprising a pair of air-permeable screens, one of said pair of screens being positioned along one side of said slit and extending across each groove of a corresponding one of said sets of grooves and the other of said pair of screens being positioned along the opposite side of said slit and extending across each groove of the other of said sets of grooves.

10. A handle and panel assembly according to claim 1, further comprising an air-permeable screen interposed between said first and second passageway means and extending thereacross.

11. A handle and panel assembly according to claim 1, wherein said base portion is removably attached to said front face of said panel.

12. A handle and panel assembly according to claim 1, wherein said channel is permanently open to permit the continuous flow of air therethrough.

13. A handle and panel assembly according to claim 1, wherein said base portion of said handle is formed of a metallic material.

* * * * *